(12) United States Patent
Jeon et al.

(10) Patent No.: US 11,152,595 B2
(45) Date of Patent: Oct. 19, 2021

(54) DISPLAY DEVICE AND METHOD FOR MANUFACTURING THE SAME

(71) Applicant: Samsung Display Co., Ltd., Yongin-si (KR)

(72) Inventors: Myoung-ha Jeon, Asan-si (KR); Jinho Kim, Daegu (KR); Hyeonjeong Oh, Yeosu-si (KR); Kichang Lee, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 42 days.

(21) Appl. No.: 16/245,431

(22) Filed: Jan. 11, 2019

(65) Prior Publication Data

US 2019/0221774 A1    Jul. 18, 2019

(30) Foreign Application Priority Data

Jan. 15, 2018    (KR) .................. 10-2018-0005247

(51) Int. Cl.

| H01L 51/52 | (2006.01) |
| H01L 51/00 | (2006.01) |
| G09F 9/30 | (2006.01) |
| G03F 7/028 | (2006.01) |
| H01L 51/56 | (2006.01) |
| G03F 7/24 | (2006.01) |
| G03F 7/095 | (2006.01) |
| G03F 7/20 | (2006.01) |
| G03F 7/00 | (2006.01) |

(52) U.S. Cl.
CPC ........ *H01L 51/5256* (2013.01); *G03F 7/0007* (2013.01); *G03F 7/028* (2013.01); *G03F 7/095* (2013.01); *G03F 7/202* (2013.01); *G03F 7/24* (2013.01); *G09F 9/301* (2013.01); *H01L 51/0097* (2013.01); *H01L 51/56* (2013.01); *H01L 2251/5338* (2013.01)

(58) Field of Classification Search
CPC . H01L 51/0097; H01L 51/56; H01L 51/5256; G09F 9/301; G03F 7/028
See application file for complete search history.

(56) References Cited

U.S. PATENT DOCUMENTS

| 8,992,796 | B2* | 3/2015 | Hasebe | C09K 19/16 252/299.01 |
| 2005/0214453 | A1* | 9/2005 | Kawanishi | C08J 7/04 427/163.2 |
| 2012/0097329 | A1* | 4/2012 | Stern | B41N 1/24 156/345.3 |

(Continued)

FOREIGN PATENT DOCUMENTS

KR    20170020627    2/2017

*Primary Examiner* — Eugene Lee
(74) *Attorney, Agent, or Firm* — H.C. Park & Associates, PLC

(57) ABSTRACT

A method for manufacturing a display device including providing a protection resin having a base resin, a first initiator, and a second initiator to the non-display area, irradiating light having a first wavelength region to the protection resin to form a preliminary protection layer, bending the flexible substrate so that the bending part has a first curvature radius, and additionally curing the preliminary protection layer to form a protection layer.

9 Claims, 9 Drawing Sheets

(56) References Cited

U.S. PATENT DOCUMENTS

| | | | |
|---|---|---|---|
| 2014/0151607 A1* | 6/2014 | Lowenthal | C09D 11/52 252/503 |
| 2016/0046830 A1* | 2/2016 | Kim | C09D 151/085 428/412 |
| 2016/0362588 A1* | 12/2016 | Moon | C09J 143/04 |
| 2017/0047547 A1* | 2/2017 | Son | H01L 25/167 |
| 2017/0237025 A1 | 8/2017 | Choi et al. | |
| 2017/0352834 A1* | 12/2017 | Kim | H01L 27/3276 |
| 2018/0327634 A1* | 11/2018 | Heo | C08K 3/34 |
| 2019/0051858 A1* | 2/2019 | Tomioka | H01L 51/0097 |

* cited by examiner

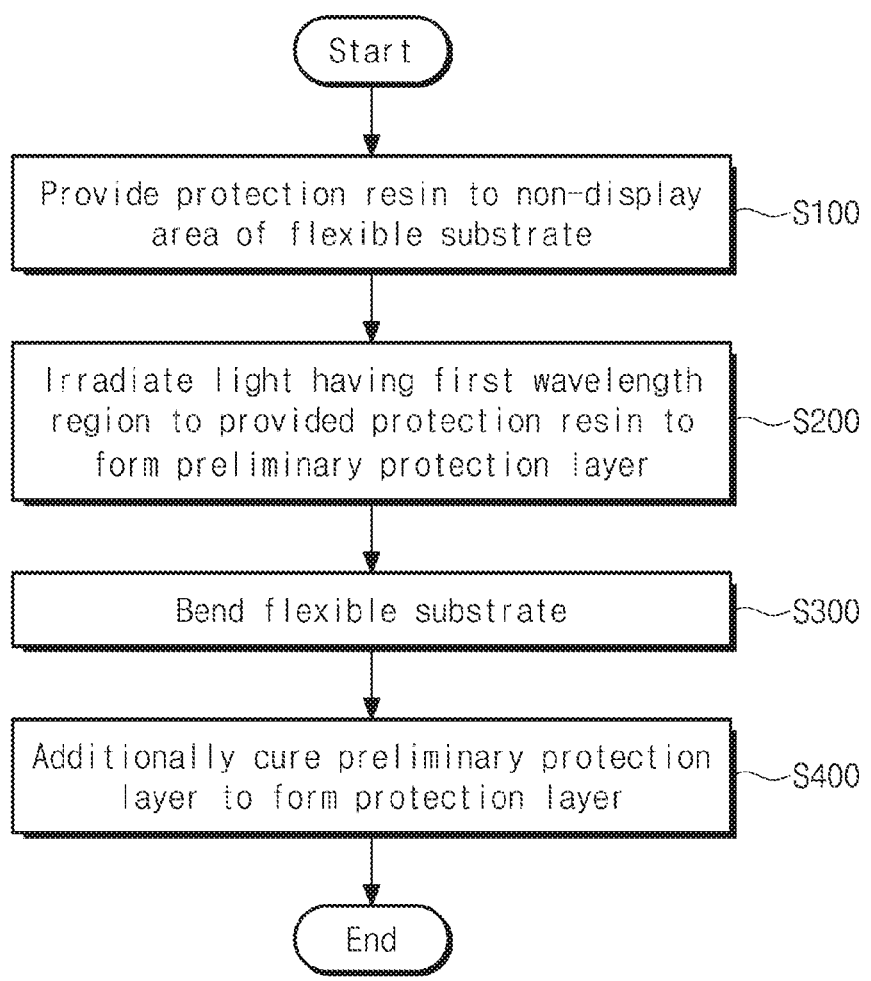

DISPLAY DEVICE AND METHOD FOR MANUFACTURING THE SAME

CROSS-REFERENCE TO RELATED APPLICATION

This application claims priority from and the benefit of Korean Patent Application No. 10-2018-0005247, filed on Jan. 15, 2018, which is hereby incorporated by reference for all purposes as if fully set forth herein

BACKGROUND

Field

Exemplary embodiments of the invention relate to a display device and a method for manufacturing the same, and more specifically, to a display device provided with a protection layer for protecting a bending part on a non-display area and a method for manufacturing the same.

Discussion of the Background

Various types of display devices are being used to provide image information. These display devices includes a substrate having a display area and a non-display area, which are divided from each other. The display area is a portion corresponding to an active area, and a plurality of pixel areas are defined on the display area. A pad part connected to a circuit board for controlling the pixel areas defined on the display area is disposed on the non-display area.

In recent years, a structure of a flexible display device, in which the non-display area is bent to improve visibility and reduce a dead space, has been proposed. Studies are actively being conducted regarding a structure of a protection layer for effectively protecting the bending part in the flexible display device and a method for providing the protection layer.

The above information disclosed in this Background section is only for understanding of the background of the inventive concepts, and, therefore, it may contain information that does not constitute prior art.

SUMMARY

Exemplary embodiments provide a display device including a protection layer for effectively protecting a bending part.

Exemplary embodiments also provide a method for manufacturing a display device, which minimizes defects during the manufacturing and improves strength of a protection layer in a final product.

Additional features of the inventive concepts will be set forth in the description which follows, and in part will be apparent from the description, or may be learned by practice of the inventive concepts.

An exemplary embodiment of the inventive concepts provide a display device including: a flexible substrate including a display area and a non-display area disposed on at least one side of the display area and including a bending part; a display panel disposed on the display area; and a protection layer disposed on the non-display area and having a modulus value of about 500 MPa to about 1,200 MPa.

The bending part may extend from the display area, and the protection layer may be disposed on the bending part.

The display device may further include a connection circuit member disposed on the non-display area and electrically connected to the display panel.

The display device may further include a connection line disposed on the bending part, wherein the protection layer may cover the connection line.

The protection layer may be disposed between the display panel and the connection circuit member to overlap a portion of at least one of the display panel or the connection circuit member.

The display device may further include a polarization plate disposed on the display panel, wherein the protection layer may not overlap the polarization plate.

The protection layer may have a mean thickness of about 80 μm to about 150 μm.

The non-display area may further include a flat part extending from the bending part to overlap the display area.

The bending part may have a curvature radius of about 0.2 nm to about 0.4 nm.

The protection layer may include an acrylic-based polymer, a silicon-based polymer, an imide-based polymer, or a combination thereof.

Another exemplary embodiment of the inventive concepts provide a display device including: a flexible substrate including a display area, a bending part extending from the display area, and a flat part extending from the bending part; a display panel disposed on the display area; a connection circuit member connected to the flat part; and a protection layer disposed on the bending part and having a modulus value of about 500 MPa to about 1,200 MPa.

Another exemplary embodiment of the inventive concepts provide a method for manufacturing a display device including a flexible substrate including a display area and a non-display area including a bending part, a display panel disposed on the display area, and a connection circuit member disposed on the non-display area, the method including: providing a protection resin including a base resin, a first initiator, and a second initiator to the non-display area; irradiating light having a first wavelength region to the protection resin to form a preliminary protection layer; bending the flexible substrate so that the bending part has a first curvature radius; and additionally curing the preliminary protection layer to form a protection layer.

The preliminary protection layer may have a modulus value of about 100 MPa to about 500 MPa.

The protection layer may have a modulus value of about 500 MPa to about 1,200 MPa.

The first initiator may include a photoinitiator that is activated by ultraviolet light having a central wavelength in a wavelength region of about 315 nm to about 395 nm.

The second initiator may include a photoinitiator that is activated by light having a second wavelength region different from the first wavelength region.

The second initiator may include a photoinitiator that is activated by a light source having a plurality of wavelength peaks in a wavelength region of about 250 nm to about 800 nm.

The additional curing of the preliminary protection layer to form the protection layer may include curing the preliminary protection layer by using a light source having a single wavelength peak or a light source having a plurality of wavelength peaks in a wavelength region of about 250 nm to about 800 nm.

The second initiator may include a thermal initiator that is activated at a temperature of about 60° C. to about 150° C.

The additional curing of the preliminary protection layer to form the protection layer may include thermally curing the preliminary protection layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concept.

FIG. 6 is a flowchart illustrating a method for manufacturing a display device according to an exemplary embodiment of the inventive concepts.

DETAILED DESCRIPTION

Figure 1:
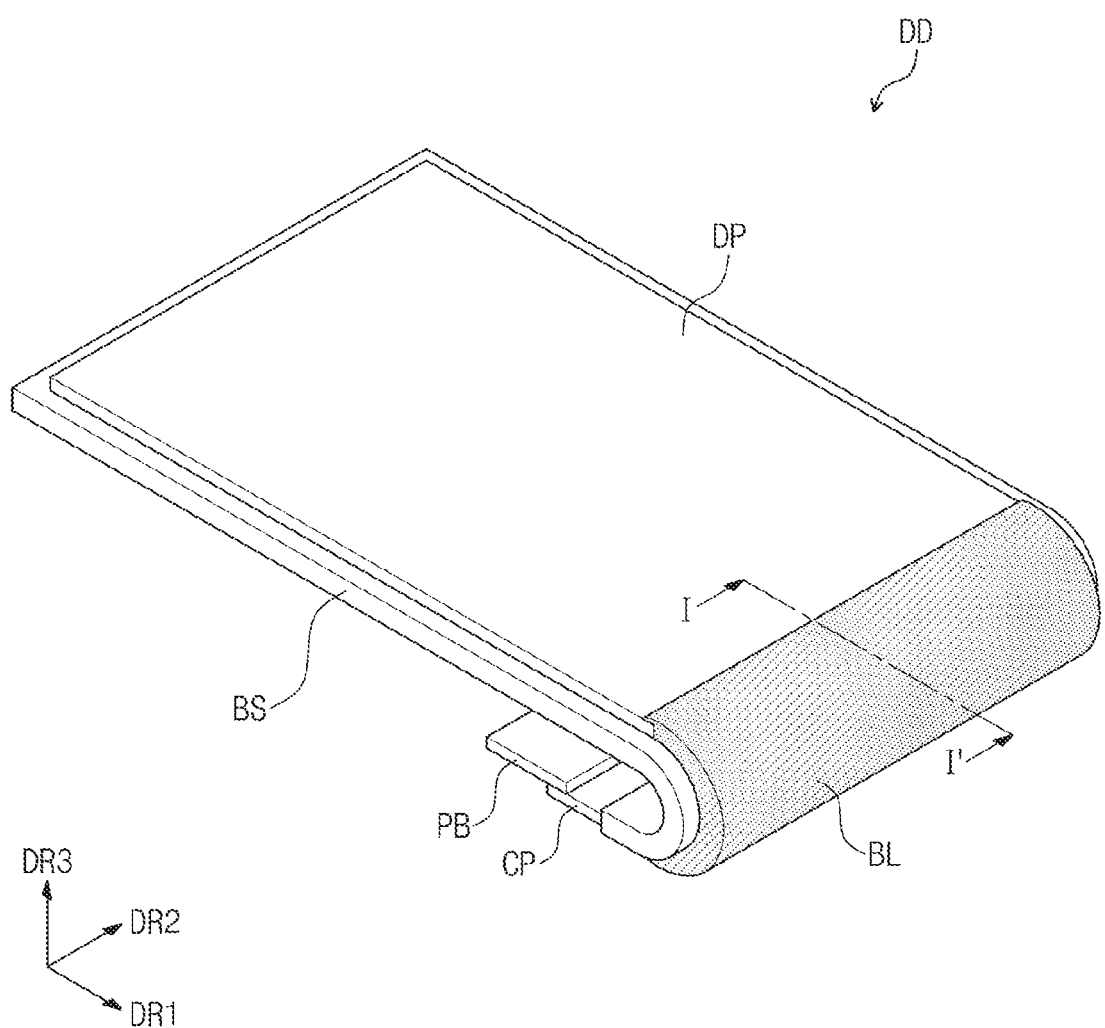
FIG. 1 is a perspective view of a display device according to an exemplary embodiment of the inventive concepts.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
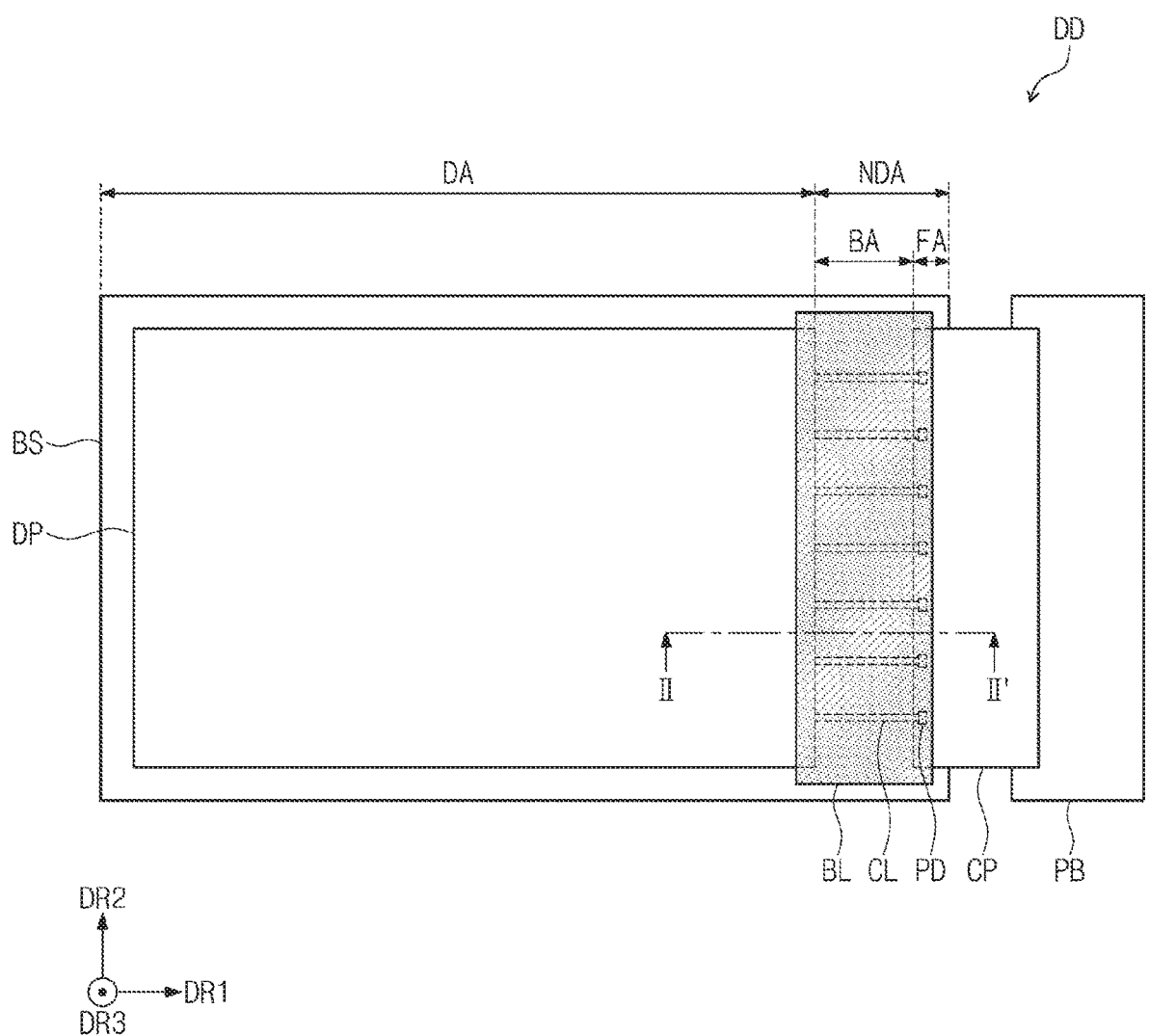
FIG. 2 is a plan view of the display device of FIG. 1 according to an exemplary embodiment of the inventive concepts.
Figure 3:
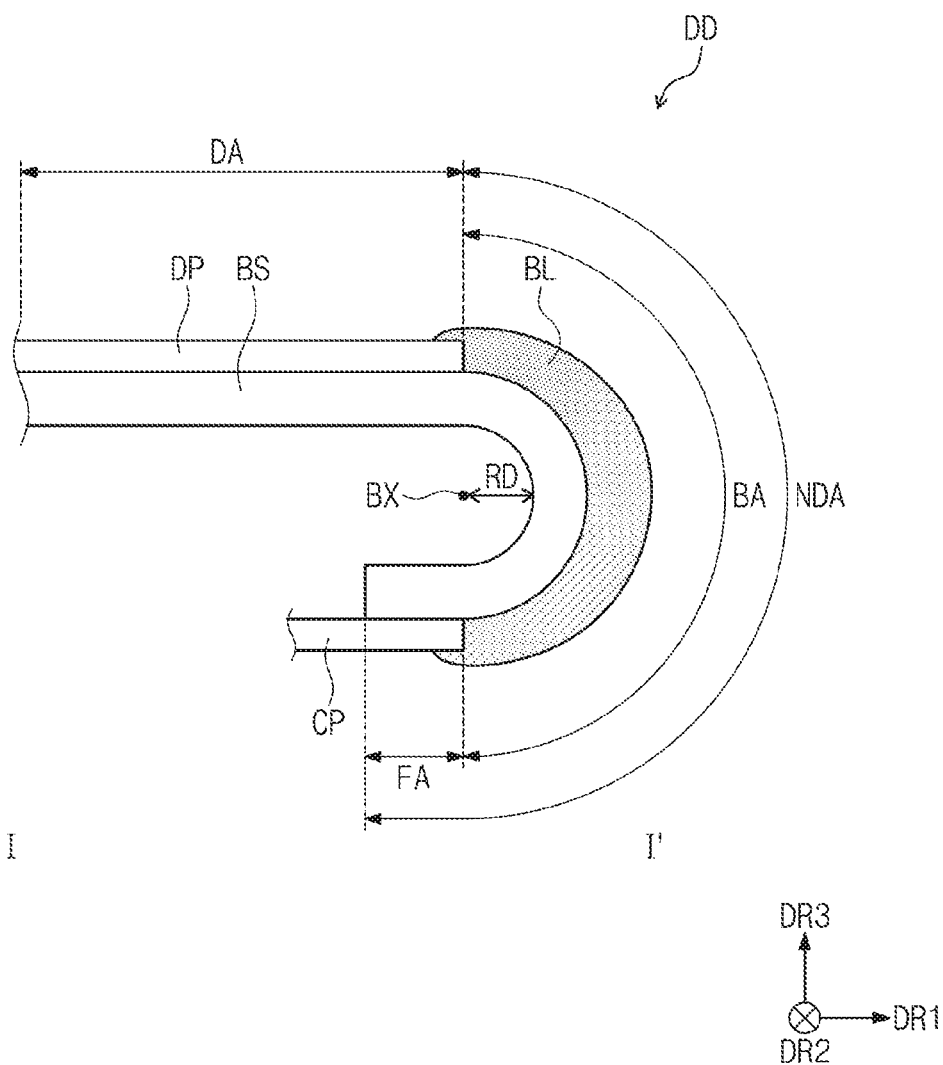
FIG. 3 is a cross-sectional view of a portion of the display device of FIG. 1, which is taken along line I-I'.

Referring to FIGS. 1 to 3, a display device DD according to an exemplary embodiment of the inventive concepts includes a flexible substrate BS and a display panel DP disposed on the flexible substrate BS. The display device DD may include a circuit board PB electrically connected to the display panel DP. The display device DD may include a connection circuit member CP connecting the display panel DP to the circuit board PB.

The flexible substrate BS provided in the display device DD may be a support member supporting the display panel DP. Also, the flexible substrate BS may be a support member on which the connection circuit member CP and a driving control part (not shown) providing an electrical signal to the display panel DP or a pad part PD to which the connection circuit member CP is connected are disposed.

The flexible substrate BS may be a plastic substrate having flexibility. Also, the flexible substrate BS may be made of a polymer material, for example, an ester-based polymer, a silicone-based polymer, an acrylic-based polymer, an imide-based polymer, or an olefin-based polymer. Particularly, the flexible substrate BS may include one selected from the group consisting of polyethylene terephthalate, polysiloxane, polyacrylate, polymethacrylate, polymethylacrylate, polymethylmethacrylate, polyethylacrylate, polyethylmetacrylate, cyclo olefin polymer, cyclo olefin copolymer, polyethylene, polypropylene, polyimide, polystyrene, polytetrafluoroethylene, polyvinylchloride, polycarbonate, polyvinylidenedifluoride, styrene acrylonitrile copolymer, and a combination thereof.

The flexible substrate BS may include a display area DA and a non-display area NDA. The display area DA of the flexible substrate BS may be a portion of the display device DD on which an image is displayed, as an areas on which the display panel DP is disposed. The non-display area NDA of the flexible substrate BS may be a portion disposed on at least one side of the display area DA, i.e., a portion on which a connection line CL electrically connecting the display panel DP to the circuit board PB, the pad part PD coming into contact with the connection circuit member CP, and the driving circuit part (not shown) controlling the display panel DP are disposed. The non-display area NDA may be an area on which an image is not displayed, such as, for example, an edge area or a bezel area in the display device DD.

The display area DA may have an approximately rectangular shape, but the inventive concepts are not limited thereto.

In the display device DD according to an exemplary embodiment of the inventive concepts, the non-display area NDA may be a portion that extends from one side of the display area DA. That is, referring to FIGS. 1 to 3, the non-display area NDA may be a portion that extends from one side of the display area DA. However, the inventive concepts are not limited thereto. For example, the non-display area NDA of the flexible substrate BS may extend from a plurality of sides of the display area DA.

In the display area DD according to an exemplary embodiment of the inventive concepts, the non-display area NDA of the flexible substrate BS may include a bending part BA. That is, at least a portion of the non-display area NDA of the flexible substrate BS may include the bending part BA. The bending part BA may a portion that extends from the display area DA and then is bent with respect to a bending axis BX. The non-display area NDA of the flexible substrate BS may include the bending part BA so that a portion of the flexible substrate BS, on which the display panel DP is not disposed, is bent to overlap the display panel DP. Thus, the display device DD may be minimized in surface area on a front surface to which a user views the display device DD. That is, in the display device DD according to an exemplary embodiment of the inventive concepts, the non-display area NDA disposed on an edge of the display area DA may be bent to minimize the dead space in which an image is not displayed or the bezel area surrounding the display area DA.

The non-display area NDA of the flexible substrate BS may further include a flat part FA. The flat part FA may be a portion that extends from the bending part BA. That is, according to an exemplary embodiment of the inventive concepts, the flexible substrate BS may include the display area DA that is a flat area, the bending part BA extending from the display area DA and bent to have a predetermined curvature radius with respect to the bending axis BX, and the flat part FA extending from the bending part BA. According to an exemplary embodiment of the inventive concepts, the flat part FA of the flexible substrate BS may be disposed to overlap the display area DA in a third directional axis DR3 that is directed in a thickness direction thereof.

The bending part BA of the flexible substrate BS may be a portion that is bent to have a curvature radius RD of about 0.2 mm to about 0.4 mm with respect to the virtual bending axis BX extending in a second directional axis DR2. According to an exemplary embodiment of the inventive concepts, the bending axis BX may be disposed between the display area DA and the flat part FA of the flexible substrate BS. According to an exemplary embodiment of the inventive concepts, the flat part FA may be disposed to overlap the display area DA.

In the display device DD of FIGS. 1 to 3, the display panel DP may be disposed on the display area DA and have a rectangular shape on a plane defined by the first directional axis DR1 and the second directional axis DR2.

The display panel DP provided in the display device DD according to an exemplary embodiment of the inventive concepts may include a liquid crystal display panel, an electrophoretic display panel, an organic light emitting display panel, a field emission display panel, a surface-conduction electron-emitter display panel, a plasma display panel, and a cathode ray display panel.

Although the display device according to an exemplary embodiment of the inventive concepts includes an organic light emitting display panel as an example, the display device according to the inventive concepts are not limited thereto. For example, a display device including various types of display panels may be used.

According to an exemplary embodiment of the inventive concepts, the display panel DP may include an organic light emitting device (not shown). The organic light emitting device (not shown) may include anode and cathode electrodes, which are disposed to face each other, and a light emitting layer disposed between the anode electrode and the cathode electrode. Also, the display panel DP may further include an encapsulation layer protecting the light emitting device (not shown), and a portion of the encapsulation layer (not shown) may be disposed to extend up to the non-display area NDA. Also, the display panel DP may further include a touch sensing unit (not shown) disposed on the encapsulation layer (not shown).

A connection line CL may be disposed on the non-display area NDA of the flexible substrate BS. The connection line CL may be disposed between the display panel DP disposed on the display area DA of the flexible substrate BS and the connection circuit member CP disposed on the non-display area NDA of the flexible substrate BS to electrically connect the display panel DP to the connection circuit member CP and thereby to transmit a signal.

The connection line CL may be made of a conductive material. The connection line CL may be disposed on the bending part BA of the flexible substrate BS and made of a conductive material having flexibility. For example, the connection line CL may include at least one metal material of gold (Au), silver (Ag), aluminum (Al), copper (Cu), titanium (Ti), or nickel (Ni). However, the inventive concepts are not limited thereto. For example, the connection line CL may be made of various metal materials for forming a circuit layer of the display panel DP. For example, the connection line CL may be performed through the same process as that for forming the circuit layer of the display panel DP.

The connection line CL may have a single layer structure made of one metal material, a single layer structure made of a plurality of metal materials, or a multilayer structure made of a plurality of metal materials. For example, the connection line CL may be a double layer line of cooper (Cu) and titanium (Ti) or a multilayer line constituted by three layers of titanium (Ti)/aluminum (Al)/titanium (Ti), but the inventive concepts are not limited thereto.

In the plan view of FIG. 2, the connection line CL connecting the display panel DP to the connection circuit member CP is expressed as a dotted line. For convenience of description in FIGS. 1 and 3 and the following drawings of the display device DD according to an exemplary embodiment of the inventive concepts, the connection line CL is not illustrated.

The display device DD according to an exemplary embodiment of the inventive concepts may include a protection layer BL disposed on the non-display area NDA. The protection layer BL may be disposed between the display panel DP and the connection circuit member CP. The protection layer BL may be disposed on the non-display area NDA to protect the connection line CL disposed on the non-display area NDA.

The protection layer BL may be disposed on the bending part BA of the non-display area NDA. The protection layer BL may cover the connection line CL and be disposed on the non-display area NDA to protect the connection line CL exposed on the flexible substrate BS and an edge portion of the display panel DP. The protection BL may prevent fractures of the connection line CL from occurring in the bending part BA and may prevent moisture from permeating into the display panel DP. Also, the protection layer BL may protect the connection line CL disposed on the bending part BA, an edge portion of the display panel DP, which is adjacent to the bending part BA, and an edge portion of the connection circuit member CP disposed on the non-display area NDA against an external impact or vibration.

The protection layer BL may have a modulus value of about 500 MPa to about 1,200 MPa. The protection layer BL may be an organic layer having a modulus value of about 500 MPa to about 1,200 MPa. The protection layer BL may be mainly disposed on the bending part BA of the non-display area NDA and expanded to the display area DA and the flat part FA of the non-display area NDA. The protection layer BL may be disposed between the display panel DP and the connection circuit member CP to partially overlap at least one of the display panel DP or the connection circuit member CP.

Referring to FIG. 3, the protection layer BL may overlap all of the edge portions of the display panel DP and the connection circuit member CP. However, the inventive concepts are not limited thereto. For example, the protection layer BL may be disposed only between the display panel DP and the connection circuit member CP and thus, not overlap the display panel DP and the connection circuit member CP. On the other hand, the protection layer BL may overlap one of a portion of the display panel DP and a portion of the connection circuit member CP.

The protection layer BL may include at least one of an acrylic-based polymer, a silicon-based polymer, or an imide-based polymer.

When the protection layer BL has a modulus value less than about 500 MPa, sufficient strength for protecting the bending part BA may not be secured to cause fractures in the protection layer BL during an impact strength test. When the protection layer BL has a modulus value exceeding about 1,200 MPa, elasticity may be reduced to cause a phenomenon in which the protection BL is easily broken. For example, the protection layer BL provided in the display device DD according to an exemplary embodiment of the inventive concepts may have a modulus value of about 700 MPa to about 1,200 MPa, particularly, a modulus value of about 700 MPa to about 1,000 MPa.

That is, the protection layer BL may have a proper modulus value of about 500 MPa to about 1,200 MPa to realize a sufficient value of flexibility that prevents fractures from occurring and provides impact resistance sufficient to protect the bending part BA against external impacts.

The display device DD of FIGS. 1 to 3 may include the circuit board PB and the connection circuit member CP disposed between the circuit board PB and the display panel DP.

The circuit board PB may be a printed circuit board on which a driving circuit chip is mounted. The circuit board PB may be disposed below the flexible substrate BS to overlap the display area DA of the flexible substrate BS. The circuit board PB may be disposed below the display panel DP to overlap the display panel DP and thereby reduce a surface area of the non-display area NDA when viewed in a plan view.

The circuit board PB may provide image data, a control signal, a power voltage, and the like to the display panel DP. The circuit board PB may include an active device and passive devices. The circuit board PB may include the pad part (not shown) connected to the connection circuit member CP.

The connection circuit member CP may have flexibility. For example, the connection circuit member CP may be provided as a tape carrier package (TCP) or a chip on film (COF). The connection circuit member CP may be electrically connected to the display panel DP and the circuit board PB. The connection circuit member CP may be connected to the connection line CL on the non-display area NDA of the flexible substrate BS. The connection circuit member CP may be connected to the connection line CL on the flat part FA of the flexible substrate BS.

Figure 4:
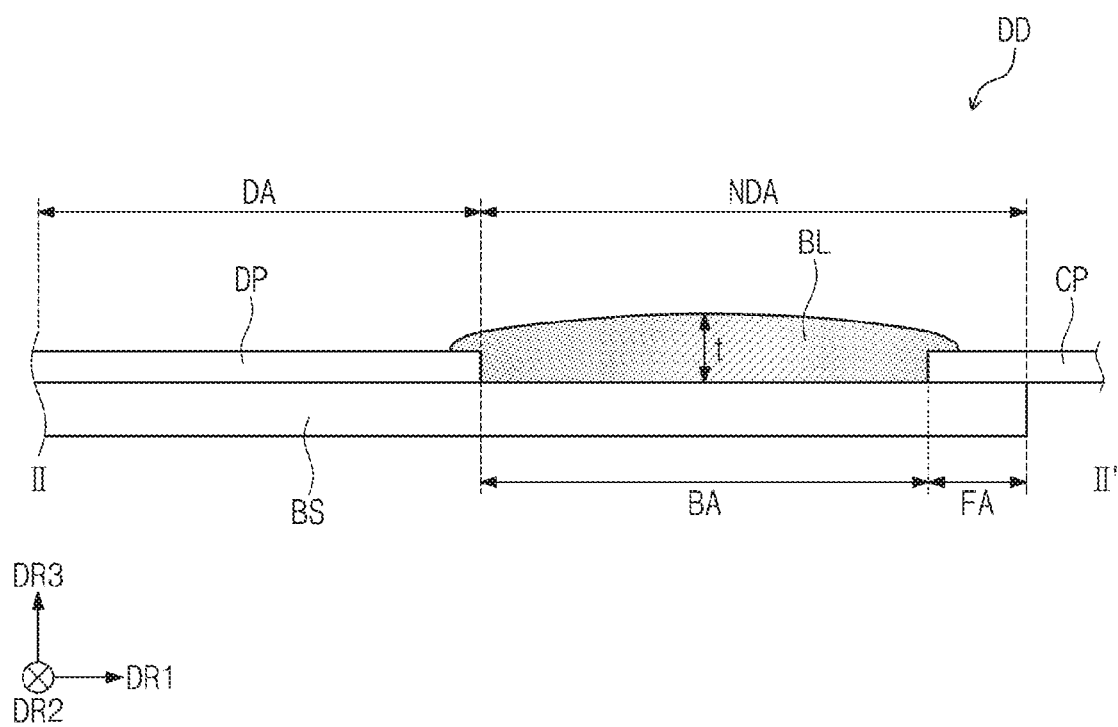
FIG. 4 is a cross-sectional view taken along line II-II' of FIG. 2.

FIG. 4 illustrates a partial cross-sectional view of the display device DD, i.e., a partial cross-sectional view when the display device DD is unfolded as illustrated in FIG. 2. FIG. 4 is a cross-sectional view taken along line II-II of FIG. 2. FIGS. 2 and 4 illustrate the display device DD in a plan view for convenience of explanation. For example, FIG. 4 illustrates a cross-section in a state in which the bending part BA is unfolded in the cross-sectional view of FIG. 3.

In an exemplary embodiment, the protection layer BL may have a mean thickness of about 80 μm to about 150 μm. The mean thickness of the protection layer BL may be a mean value of a thickness d of the protection layer BL disposed on one surface of the flexible substrate BS of the non-display area NDA. That is, the mean thickness of the protection layer BL may be a value obtained by arithmetically averaging a value of the thickness t of the protection layer BL measured at the shortest distance from a top surface of the flexible substrate BS to a top surface of the protection layer BL.

Although the protection layer BL has a relatively large thickness at a middle portion of the protection layer BL, i.e., in the periphery of a center of the bending part BA in FIG. 4, the shape of the protection layer BL in the drawings is illustrative, and thus, the inventive concepts are not limited thereto. For example, the protection layer BL at a portion thereof adjacent to the display panel DP or a portion thereof adjacent to the connection circuit member CP may have a thickness greater than that of the protection layer BL at a central portion thereof.

When the protection layer BL has a mean thickness less than about 80 μm, the protection layer BL may not have sufficient strength to protect the connection line CL disposed on the bending part BA. Also, when the protection layer has a mean thickness exceeding about 150 μm, the display device DD corresponding to the bending part BA may increase in thickness to such an extent that the bending property at the bending part BA of the flexible substrate BS is deteriorated.

In the display device DD according to the inventive concepts, a support film (not shown) may be further disposed on a bottom surface of the flexible substrate BS. The support film (not shown) may be disposed below the flexible substrate BS. The support film (not shown) may be integrated with the flexible substrate BS or be disposed to correspond to the flexible substrate BS at a remaining portion except for a portion corresponding to the bending part BA of the flexible substrate BS.

Figure 5:
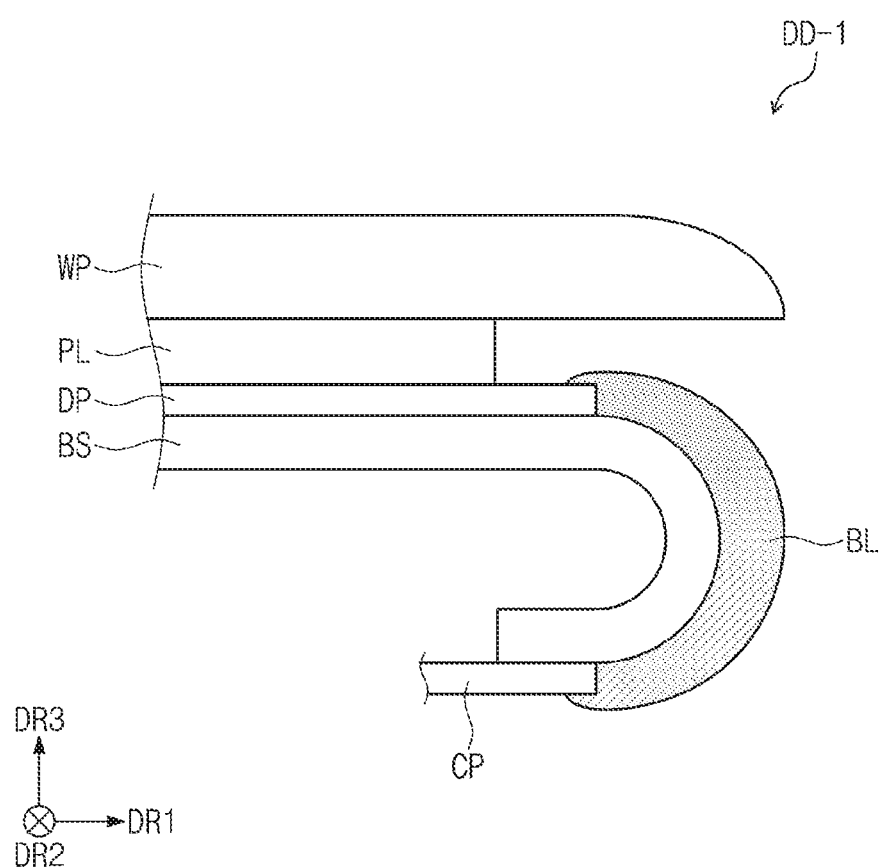
FIG. 5 is a cross-sectional view of a display device according to an exemplary embodiment of the inventive concepts.

FIG. 5 is a cross-sectional view of the display device according to an exemplary embodiment of the inventive concepts. A display device DD-1 of FIG. 5 according to an exemplary embodiment of the inventive concepts may further include a polarization plate PL and a window member WP when compared with the display device DD of FIGS. 1 to 4.

The display device DD-1 according to an exemplary embodiment of the inventive concepts may include the polarization plate PL disposed on the display panel DP. The polarization plate PL may be disposed on the display panel DP to reduce reflection due to external light, thereby improving display quality of the display device DD-1. The polarization plate PL may include a polarizer and a phase retarder. The polarization plate PL may be disposed on the display panel DP and does not overlap the protection layer BL. That is, the protection layer BL may overlap an edge portion of the display panel DP, but does not overlap the polarization plate PL on the plane in order to minimize an increase in thickness of the protection layer BL and thereby prevent the total thickness of the display device DD-1 from increasing so that the bending part BA and the protection layer BL are easily bent.

The display device DD-1 may further include the window member WP. The window member WP may be disposed on the polarization plate PL. Also, unlike what is illustrated in the drawing, in another exemplary embodiment, the window member WP may be disposed on the display panel DP. In that case, the polarization plate PL may be omitted.

The window member WP may be disposed on the display panel DP to overlap the display area DA and a portion of the non-display area NDA. The window member WP may be disposed on the display panel DP to serve as a protection board for protecting the display panel DP. Also, the window member WP defines a front surface of the display device DD-1 to provide an input surface/a touch surface/a display surface for inputting user's information into the display device DD-1. The window member WP may be flexible. Also, although not shown in the drawings, an optical transparent adhesion layer may be further disposed between the display panel DP and the window member WP or between the polarization plate PL and the window member WP. The window member WP may include a glass substrate or a plastic substrate.

The display device according to an exemplary embodiment may include the flexible substrate having the bending part and provide the protection layer on the bending part to protect the connection line exposed on the bending part and the display panel against the external impact. Also, the display device according to an exemplary embodiment of the inventive concepts may provide the protection layer having the modulus value of about 500 MPa to about 1,200 MPa on the bending part to minimize the occurrence of fractures and realize the high strength, thereby effectively protecting the display device against external impacts.

Hereinafter, a method for manufacturing the display device according to an exemplary embodiment of the inventive concepts will be described with reference to FIGS. 6 and 7A to 7E. In description of the method for manufacturing the display device according to exemplary embodiment of the inventive concepts, the display device may be applied to the display device according to the abovementioned exemplary embodiment of the inventive concepts. Hereinafter, in description of the method for manufacturing the display device according to an exemplary embodiment of the inventive concepts, duplicated description will be omitted, and thus, differences therebetween will be mainly described.

FIG. 6 is a flowchart illustrating the method for manufacturing the display device according to an exemplary embodiment of the inventive concepts, and FIGS. 7A to 7E are schematic views for explaining the method for manufacturing the display device according to an exemplary embodiment of the inventive concepts.

The method for manufacturing the display device according to an exemplary embodiment of the inventive concepts may be a method for manufacturing the display devices DD and DD-1 of FIGS. 1 to 5. An exemplary embodiment of the inventive concepts provides a method for manufacturing a display device including a protection layer BL protecting a bending part BA of each of the display devices DD and DD-1.

The method for manufacturing the display device according to an exemplary embodiment of the inventive concepts may include a process (S100) of providing a protection resin to a non-display area of a flexible substrate, a process (S200) of irradiating light having a first wavelength region to the protection resin to form an preliminary protection layer, a process (S300) of bending the flexible substrate, and a process (S400) of additionally curing the preliminary protection layer to form a protection layer.

The process (S100) of providing the protection resin to the non-display area of the flexible substrate may be a process of providing a protection resin BR on a non-display area NDA of a flexible substrate BS on which a display panel DP and a connection circuit member CP are disposed. That is, the protection resin BR may be provided after the display panel DP and the connection circuit member CP are disposed on the flexible substrate BS. The protection resin BR may be mainly provided to a bending part of the non-display area NDA. The protection resin BR may be provided to cover an edge portion of the display panel DP, which is adjacent to the non-display area NDA, and a portion of a connection circuit member CP disposed on an edge of the non-display area NDA as well as the bending part BA.

The protection resin BR may include a base resin, a first initiator, and a second initiator different from the first initiator. The base resin may include at least one of an acrylic-based resin, a silicon-based resin, or an imide-based resin. The base resin may be provided in the form of a monomer or oligomer of the acrylic-based resin, the silicon-based resin, or the imide-based resin.

The protection resin BR may include two or more initiators different from each other. For example, in the protection resin BR used according to an exemplary embodiment of the inventive concepts, the first initiator may be a photoinitiator, and the second initiator may be a photoinitiator or a thermal initiator.

The first initiator may be a photoinitiator that is activated by light having a first wavelength region. The first initiator may be a photoinitiator that is activated by ultraviolet light having a central wavelength in a wavelength region of about 315 nm to about 395 nm. In this specification, the central wavelength represents a wavelength representing a maximum intensity of an emission peak in an emission spectrum of a light source. Particularly, the first photoinitiator may be a photoinitiator that is activated by the light source having a single wavelength peak, and the central wavelength of the single wavelength peak may range of about 315 nm to 395 nm. A full width at half maximum (FWHM) of the single wavelength peak may be about 60 nm or less. For example, the FWHM of the single wavelength peak may range of about 5 nm to about 30 nm. Also, in this specification, the light source having the single wavelength peak represents a light source having one emission peak in the proposed wavelength range.

For example, the first initiator may be activated by ultraviolet light having a central wavelength in a wavelength region of about 330 nm to about 380 nm. Particularly, the first initiator may be activated by ultraviolet light having a single wavelength peak in the wavelength region of about 330 nm to about 380 nm.

Particularly, the first initiator may be a first ultraviolet photoinitiator that is activated in light having a central wavelength of about 345 nm or a second ultraviolet photoinitiator that is activated in light having a central wavelength of about 365 nm.

For example, the first ultraviolet photoinitiator may be one selected from 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, and 2-hydroxy-1-{4-[4-(2-hydroxy-2-methyl-propionyl)-benzyl]-phenyl}-2-methylpropan-1-one.

Also, the second ultraviolet photoinitiator may be one selected from 2-methyl-1[4-(methylthio)phenyl]-2-morpholinopropan-1-one, 2-benzyl-2-dimethylamino-1-(4-morpholinophenyl)-butanone-1, 2-dimethylamino-2-(4-methylbenzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphineoxide, [1-(4-phenylsulfanylbenzoyl)heptylideneamino]benzoate, [1-[9-ethyl-6-(2-methylbenzoyl)carbazol-3-yl]ethylideneaminol]acetate, and Bis(2,4-cyclopentadienyl)bis[2,6-difluoro-3-(1-pyrryl)phenyl]titanium(IV).

When both the first initiator and the second initiator are the photoinitiators in an exemplary embodiment, the first initiator and the second initiator may have activated central wavelength regions different from each other. For example, the first initiator may be a first ultraviolet photoinitiator, and the second initiator may be a second ultraviolet photoinitiator that is activated in a wavelength relatively longer than that of the first initiator. On the other hand, the first initiator may be the second ultraviolet photoinitiator, and the second initiator may be the first ultraviolet photoinitiator. The second initiator may be a photoinitiator that is activated in a long wavelength region rather than the ultraviolet wavelength region. For example, the second initiator may be a photoinitiator that is activated in a wavelength region of about 380 nm, and the first initiator may be a second ultraviolet photoinitiator that is activated in a wavelength region having a central wavelength of about 365 nm.

The second may be a photoinitiator that is activated by a light source having a single wavelength peak in a second wavelength region having a wavelength longer than that of the first wavelength region in which the first initiator is activated. For example, the second initiator may be activated by an LED light source having a single wavelength peak in a wavelength of about 380 nm. Particularly, the second initiator may be a photoinitiator that is activated by an LED light source having a central wavelength of about 400 nm or about 500 nm.

On the other hand, the second initiator may be a photoinitiator that is activated by a light source having a plurality of wavelength peaks in a wavelength region of about 250 nm to about 800 nm. The second initiator may be a photoinitiator that is activated by a light source having a plurality of wavelength peaks in a wavelength region of about 250 nm to about 800 nm such as a metal halide lamp or a mercury lamp.

In an exemplary embodiment, the first initiator provided in the protection resin BR may be a photoinitiator, and the second initiator provided in the protection resin BR may be a thermal initiator. The first initiator may be a first ultraviolet photoinitiator or a second ultraviolet photoinitiator. On the other hand, the second initiator may be a thermal initiator that is activated when heat is provided.

Kinds of thermal initiators provided in the protection resin BR may vary according to a temperature of heat provided during the process of manufacturing the display device and a time taken to perform a high-temperature process. For example, the thermal initiator provided as the second initiator may be activated at a temperature of about 60° C. to about 150° C. Particularly, the thermal initiator provided as the second initiator may be activated at a temperature of about 70° C. to about 150° C. More particularly, the thermal initiator provided as the second initiator may be activated at a temperature of about 80° C. to about 120° C.

The inventive concepts are not limited thereto. For example, the thermal initiator provided as the second initiator may be activated at a temperature greater than room temperature (about 25° C.). For example, the thermal initiator provided as the second initiator may be activated at a temperature of about 40° C. or more.

The thermal initiator used as the second initiator may be at least one selected from the group consisting of an azo compound, a peroxyester compound, a peroxy dicabonate compound, and an acyl peroxide compound. Alternatively, the thermal initiator may be a redox-based initiator.

According to an exemplary embodiment of the inventive concepts, the thermal initiator provided in the protection resin BR may be at least one selected from the group consisting of tert-Amyl peroxybenzoate, 4,4'-Azobis(4-cyanopentanoic acid), 1,1'-Azobis(cyanocyclohexane), azobisisobutylronitirile (AIBN), 2,2-Bis(tert-butylperoxy)butane, 1,1-Bis(tert-butylperoxy)cyclohexane, benzoyl peroxide (BPO), 2,5-Bis(tert-butylperoxy)-2,5-dimethylhexane, Bis [1-(tert-butylperoxy)-1-methylethyl]benzene, 1,1-Bis(tert-butylperoxy)-3,3,5-trimethylcyclohexane, tert-Butyl hydroperoxide, tert-Butyl peracetate, tert-Butyl peroxide, tert-Butyl peroxybenzoate, tert-Butylperoxy isopropyl carbonate, cumene hydroperoxide, cyclohexanone peroxide, dicumyl peroxide, dodecanoyl peroxide, 2,4-pentanedione peroxide, and potassium peroxodisulfate.

Figure 7A:
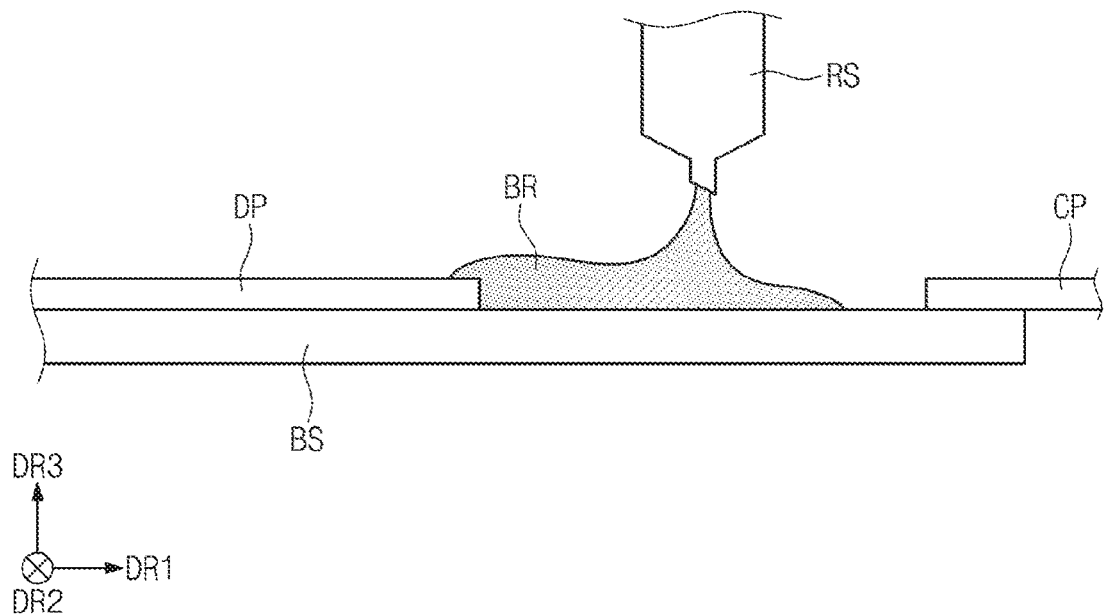
FIG. 7A, FIG. 7B, FIG. 7C, FIG. 7D, and FIG. 7E are schematic views sequentially illustrating processes in the method for manufacturing the display device according to an exemplary embodiment of the inventive concepts.

FIG. 7A illustrates the process of providing the protection resin BR. The protection resin BR may be provided on the flexible substrate BS through a supply nozzle RS. In the process of providing the protection resin BR, the protection resin BR may be provided on the non-display area NDA of the flexible substrate BS through various methods. For example, the protection resin BR may be provided on the flexible substrate BS through various methods such as a jetting method, a slit coating method, a spin coating method, and a transfer coating method.

Figure 7B:
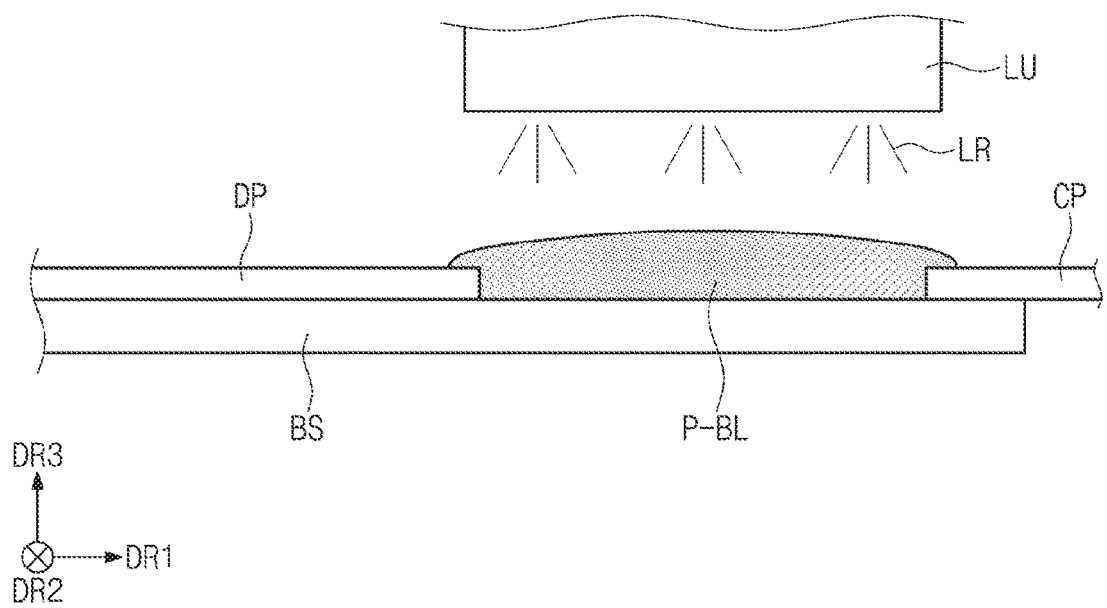

FIG. 7B illustrates the process of providing the light having the first wavelength region to the provided protection resin BR to form the preliminary protection layer P-BL. The process of forming the preliminary protection layer P-BL may be a process of irradiating light having a first wavelength region, which is emitted from an external light source LU, to the protection resin BR to polymerize or cure a base resin of the protection resin BR. The external light source LU may provide ultraviolet light LR having the first wavelength region. According to an exemplary embodiment of the inventive concepts, the ultraviolet light LR may be ultraviolet light having a central wavelength of about 345 nm or ultraviolet light having a central wavelength of about 365 nm. For example, the external light source LU may include a metal halide lamp.

The protection resin BR provided on the non-display area NDA of the flexible substrate BS may be polymerized and cured by the light having the first wavelength region to form the preliminary protection layer P-BL. The preliminary protection layer P-BL may be disposed on the bending part BA to overlap a portion of the display panel and a portion of the connection circuit member CP, which are adjacent to the bending part BA.

The preliminary protection layer P-BL may be in a state in which the base resin of the protection resin BR is completely cured. The preliminary protection layer P-BL may include a base resin in which the polymerization reaction and the curing are completed, the non-reacting base resin, and the second initiator.

The preliminary protection layer P-BL may have a modulus value of about 100 MPa to about 500 MPa. When the preliminary protection layer P-BL has a modulus value less than about 100 MPa, the preliminary protection layer P-BL may not be maintained in shape during the bending process that is performed later due to the low modulus value. Also, when the preliminary protection layer P-BL has a modulus value of about 500 MPa or more, fractures may occur in the preliminary protection layer P-BL during the bending process due to the high modulus value.

Figure 7C:
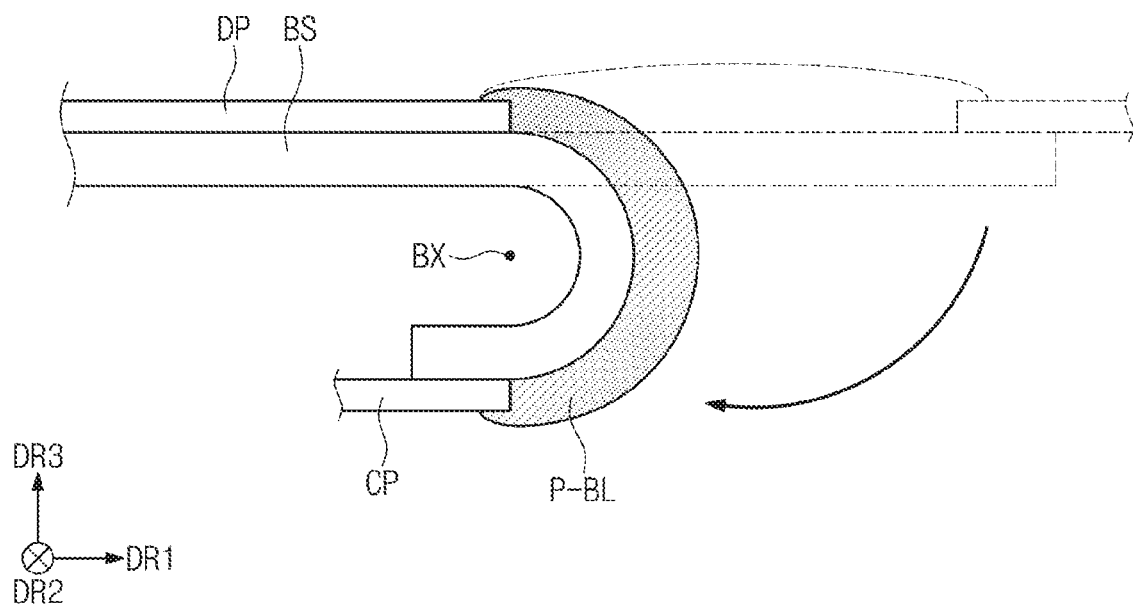

FIG. 7C illustrates the process of bending the flexible substrate. The flexible substrate BS may be bent with respect to a bending axis BX to have a first curvature radius. In the bending process, the flexible substrate BS and the preliminary protection layer P-BL may be bent. Here, the preliminary protection layer P-BL may be formed to have a modulus value of about 100 MPa to about 500 MPa through primary curing to prevent the fractures from occurring even after the bending process is performed.

Figure 7D:
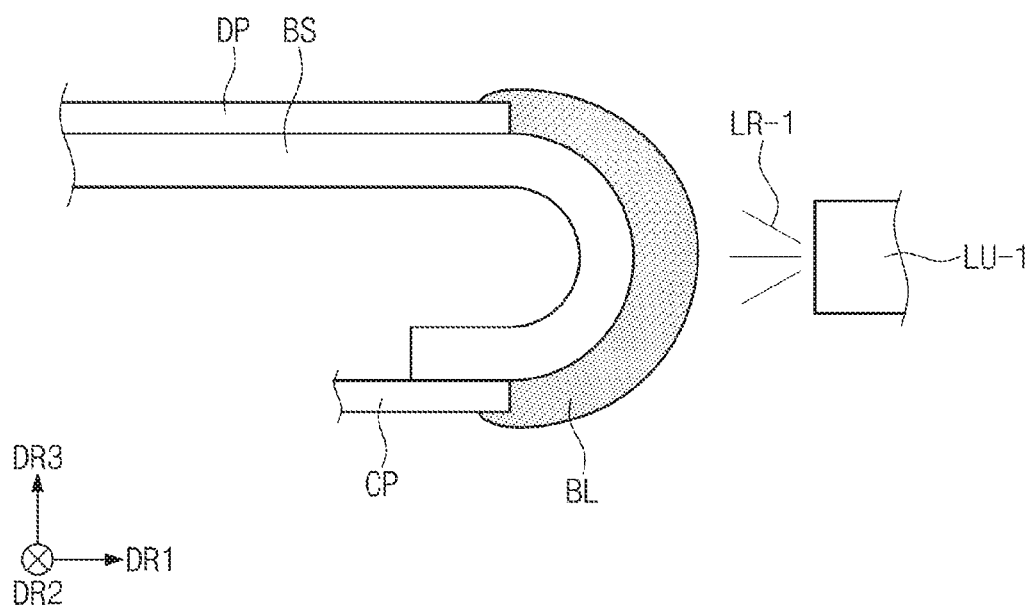

FIG. 7D illustrates the process (S400) of additionally curing the preliminary protection layer to form the protection layer. The preliminary protection layer P-BL formed through the primary curing may be additionally cured to finally form the protection layer BL having a modulus value of about 500 MPa to about 1,200 MPa.

The additional curing may be performed by additionally performing photo curing or thermal curing on the preliminary protection layer P-BL. For example, when the second initiator provided in the protection resin BR is the photoinitiator, the additional curing may be a process of additionally performing the photo curing on the preliminary protection layer P-BL. On the other hand, when the second initiator is the thermal initiator, the additional curing may be a process of additionally thermally curing the preliminary protection layer P-BL.

When the process (S400) of additionally curing the preliminary protection layer to form the protection layer is a process of performing the photo curing on the preliminary protection layer, the photo curing is performed on the preliminary protection layer by using a light source having a single wavelength peak or a light source having a plurality of wavelength peaks in a wavelength region of about 250 nm to about 800 nm. Here, an LED may be used as the light source having the single wavelength peak. A metal halide lamp or a mercury lamp may be used as the light source having the plurality of wavelength peaks. Although the additional curing is the photo curing in FIG. 7D, the inventive concepts are not limited thereto. For example, the additional curing may be performed by performing additional polymerization reaction and curing reaction on the preliminary protection layer P-BL by using light LR-1 having a second wavelength region, which is provided from an external light source LU-1 that provides the light having the second wavelength region different from the first wavelength region.

In the additional curing process, the second initiator may be activated by the light LR-1 having the second wavelength region to allow a non-reaction monomer or oligomer, which remains on the preliminary protection layer P-BL to additionally react, thereby finally forming a protection layer BL having a high modulus value of about 500 MPa to about 1,200 MPa.

Unlike the additional curing of FIG. 7D, the additional curing may be a process of thermally curing the preliminary protection layer P-BL. For example, when the second initiator provided in the protection resin BR is the thermal initiator, the additional curing may be a process of providing heat to the preliminary protection layer P-BL to additionally cure the preliminary protection layer P-BL. Here, the additional curing may be performed in a high-temperature chamber. In the additional curing process, the non-reaction monomer or oligomer may be additionally polymerized or cured by the thermal initiator that is activated at a high temperature to finally form a protection layer BL having a high modulus value of about 500 MPa to about 1,200 MPa.

When the process (S400) of additionally curing the preliminary protection layer to form the protection layer is the process of thermally curing the preliminary protection layer, the process of thermally curing the preliminary protection layer may be performed at a temperature of about 60° C. to about 150° C. For example, the process (S400) of additionally curing the preliminary protection layer to form the protection layer may be performed at a temperature of about 70° C. to about 150° C., more particularly, performed at a temperature of about 80° C. to about 120° C.

The inventive concepts are not limited thereto. For example, when the process (S400) of additionally curing the preliminary protection layer to form the protection layer is the process of thermally curing the preliminary protection layer, the process (S400) of additionally curing the preliminary protection layer to form the protection layer may be performed at room temperature or more. For example, the process (S400) of additionally curing the preliminary protection layer to form the protection layer may be performed at a temperature of about 40° C. or more.

Figure 7E:
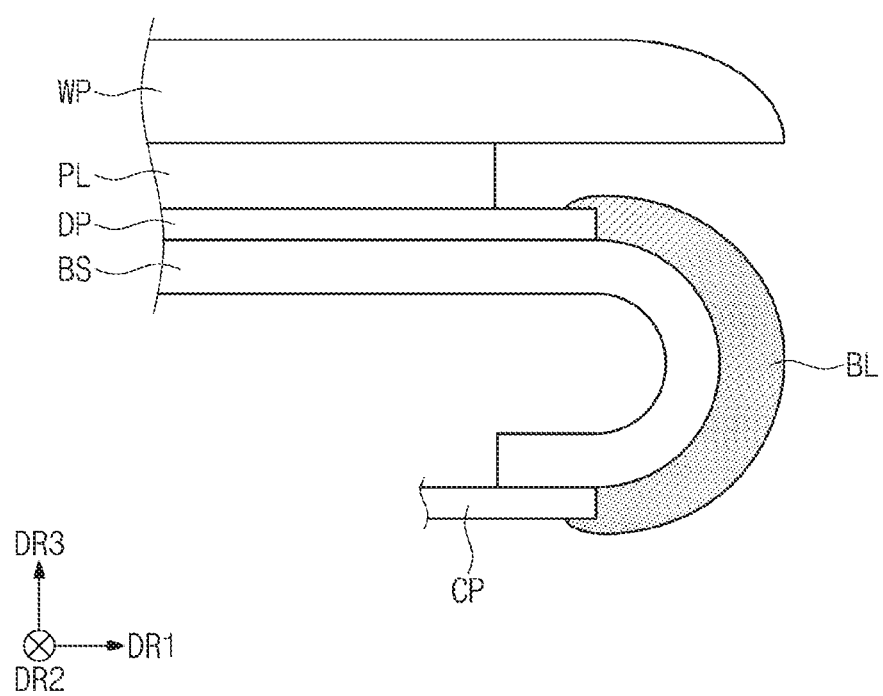

FIG. 7E illustrates a process of additionally providing the polarization plate PL and the window member WP on the display panel DP. The polarization plate PL and the window member WP may be sequentially provided on the display panel DP after the protection layer BL is formed. However, the inventive concepts are not limited thereto. For example, the polarization plate PL may be provided before the protection layer BL is formed. For example, the polarization plate PL may be provided on the display panel DP before the process of providing the protection resin BR described with reference to FIG. 7A.

Table 1 shows results obtained by comparing physical properties of the protection layer in the display device manufactured through the method for manufacturing the display device in which the protection resin is cured through a single step according to the related art and the method for manufacturing the display device in which the protection resin is cured through the two steps. Comparative Example in Table 1 shows evaluation results for the display device manufactured through the method for manufacturing the display device in which the curing process is performed in the single step, Embodiment A shows physical properties of the protection layer and the display device after the primary curing process is performed in the method for manufacturing the display device according to an exemplary embodiment, and Embodiment B shows physical properties of the protection layer and the display device, which are finally manufactured after the additional curing process is performed.

TABLE 1

| Evaluation Items | Comparative Example | Embodiment A | Embodiment B |
| --- | --- | --- | --- |
| Modulus (MPa) | 300 | 160~250 | 700 or more |
| Bending Stress (MPa) | 5 | 2~4 | 6 or more |
| Adhesion Force (N/cm) | 5 | 5 | 5 |

In the evaluation items of Table 1, the modulus (MPa) was evaluated by using dynamic mechanical analysis (DMA). When compared with Comparative Example, it is seen that a protection layer according to Example A, in which only primary curing is performed, has a low modulus value, and a protection layer according to Embodiment B, which is finally cured, has a high modulus value of about 700 MPa or more. That is, since the low modulus value in Example A has a relatively low modulus value when compared with Comparative Example, stress applied during the bending may be reduced when compared with Comparative Example. It is seen that a protection layer having strength greater than that in Comparative Example is realized in Embodiment B that is the final state.

The bending stress represents a stress value to withstand at the bending part under a condition of about 50%. It is seen that, in the final cured state in Embodiment B, a relatively high bending stress value is obtained when compared with Comparative Example. Also, the adhesion force is comparable in Comparative Example and Embodiments A and B.

Thus, in case of various exemplary embodiments, the protection layer may have a high modulus value and a high bending stress value while having the adhesion force with a level similar to that in Comparative Example to protect the bending part against the external impact and the bending stress.

The method for manufacturing the display device according to the abovementioned exemplary embodiment may include the two curing processes that are performed before and after the process of bending the flexible substrate to manufacture the display device in which the protection layer having the high strength while preventing cracks from occurring is provided to the bending part. Also, in the method for manufacturing the display device according to an exemplary embodiment of the inventive concepts, the display device including the protection layer having the improved strength without damage of the protection layer due to the bending process may be manufactured.

That is, in the method for manufacturing the display device according to an exemplary embodiment of the inventive concepts, the process of primarily curing the protection resin provided on the flexible substrate may be performed before the process of bending the flexible substrate, and the process of additionally curing the primarily cured protection layer after the process of bending the flexible substrate so that the protection layer has flexibility and strength that are enough to prevent the protection layer from being damaged during the bending process. Therefore, the display device may be manufactured which includes the protection layer having the improved strength against the external impact. In the method for manufacturing the display device according to an exemplary embodiment of the inventive concepts, the protection resin provided before the bending process may be sufficiently cured to improve the physical property of the protection layer, when compared with the method for manufacturing the display device including the protection layer according to the related art, thereby effectively protecting the bending part of the flexible substrate and the connection lines provided on the bending part.

In addition, the display device according to an exemplary embodiment may include the protection layer having the high bending stress resistance and the high impact resistance against the external impact on the bending part of the flexible substrate in order to improve various mechanical properties.

Exemplary embodiments of the inventive concepts provide a display device that provides a protection layer having a high modulus value to the bending part to improve impact strength.

Exemplary embodiments of the inventive concepts also provide a method for manufacturing the display device, which includes a curing process before and after the bending to minimize the occurrence of the cracks during the bending and increase the modulus of the final protection layer.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method for manufacturing a display device comprising a flexible substrate comprising a display area and a non-display area comprising a bending part, a display panel disposed on the display area, and a connection circuit member disposed on the non-display area, the method comprising the steps of, in this order:

providing a protection resin comprising a base resin, a first initiator, and a second initiator to the non-display area;

irradiating light having a first wavelength region to the protection resin to form a preliminary protection layer;

bending the flexible substrate so that the bending part has a first curvature radius; and additionally curing the preliminary protection layer to form a protection layer.

2. The method of claim 1, wherein the preliminary protection layer has a modulus value of 100 MPa to 500 MPa.

3. The method of claim 1, wherein the protection layer has a modulus value of 500 MPa to 1,200 MPa.

4. The method of claim 1, wherein the first initiator comprises a photoinitiator that is activated by ultraviolet light having a central wavelength in a wavelength region of 315 nm to 395 nm.

5. The method of claim 1, wherein the second initiator comprises a photoinitiator that is activated by light having a second wavelength region different from the first wavelength region.

6. The method of claim 1, wherein the second initiator comprises a photoinitiator that is activated by a light source having a plurality of wavelength peaks in a wavelength region of 250 nm to 800 nm.

7. The method of claim 1, wherein the additionally curing of the preliminary protection layer to form the protection layer comprises curing the preliminary protection layer by using a light source having a single wavelength peak or a light source having a plurality of wavelength peaks in a wavelength region of 250 nm to 800 nm.

8. The method of claim 1, wherein the second initiator comprises a thermal initiator that is activated at a temperature of 60° C. to 150° C.

9. The method of claim 1, wherein the additionally curing of the preliminary protection layer to form the protection layer comprises thermally curing the preliminary protection layer.

* * * * *